(12) United States Patent
Wang et al.

(10) Patent No.: US 7,759,986 B2
(45) Date of Patent: Jul. 20, 2010

(54) GATE OXIDE PROTECTED I/O CIRCUIT

(75) Inventors: Dar-Woei Wang, Hsinchu County (TW); Yi-Heng Liu, Taipei (TW)

(73) Assignee: Elite Semiconductor Memory Technology Inc (TW)

( * ) Notice: Subject to any disclaimer, the term of this patent is extended or adjusted under 35 U.S.C. 154(b) by 0 days.

(21) Appl. No.: 12/471,267

(22) Filed: May 22, 2009

(65) Prior Publication Data

US 2009/0231016 A1    Sep. 17, 2009

Related U.S. Application Data

(62) Division of application No. 11/036,463, filed on Jan. 13, 2005, now abandoned.

(51) Int. Cl.
*H03K 3/00* (2006.01)
(52) U.S. Cl. ........................................ 327/108; 327/143
(58) Field of Classification Search .................. 327/108, 327/143
See application file for complete search history.

(56) References Cited

U.S. PATENT DOCUMENTS

| | | | |
|---|---|---|---|
| 4,709,162 A | 11/1987 | Braceras et al. | 326/81 |
| 5,132,576 A | 7/1992 | Park | 327/51 |
| 5,389,842 A | 2/1995 | Hardee | 327/391 |
| 5,479,116 A | 12/1995 | Sallaerts et al. | 326/80 |
| 5,729,155 A | 3/1998 | Kobatake | 326/68 |
| 6,266,291 B1 | 7/2001 | Sher et al. | 365/226 |
| 6,642,757 B2 * | 11/2003 | Ikehashi et al. | 327/143 |
| 7,071,739 B1 | 7/2006 | Duzevik et al. | 327/108 |
| 7,078,935 B2 | 7/2006 | Choi | 326/82 |
| 7,573,306 B2 * | 8/2009 | Kumazaki et al. | 327/143 |
| 7,656,210 B2 * | 2/2010 | Seki et al. | 327/198 |

\* cited by examiner

*Primary Examiner*—Kenneth B. Wells
(74) *Attorney, Agent, or Firm*—Hogan Lovells US LLP (57) ABSTRACT

An integrated circuit comprises a first input node and a second input node, an output node; a first output transistor of a first type and a second output transistor of a second type, and a first clamping transistor of the second type and a second clamping transistor of a second type. The first clamping transistor, the first output transistor, the second clamping transistor, and the second output transistor are coupled in series across a first power supply terminal and a second power supply terminal. The first input node is coupled to a gate of the first output transistor. The second input node is coupled to a gate of the second output transistor. The output node is coupled to a common node of the first output transistor and the second clamping transistor. A gate of the first clamping transistor is coupled to a first reference voltage. A gate of the second clamping transistor is coupled to a second reference voltage.

8 Claims, 8 Drawing Sheets

GATE OXIDE PROTECTED I/O CIRCUIT

This application is a divisional of application Ser. No. 11/036,463, filed on Jan. 13, 2005, which is incorporated herein by reference.

FIELD OF THE INVENTION

The present invention relates to an integrated circuit, and more particularly to a gate oxide protected I/O circuit.

BACKGROUND

In order to save power, the core circuitry of a device, for example a microprocessor, usually operates on a predetermined lower voltage level, even though the device must communicate externally using an input/output (I/O) voltage level which is higher than the predetermined voltage used by the core of the device. For example, a microprocessor chip operates on logic levels of high (H) and low (L) having voltage levels of 3.3 volts (V) and 0 V, respectively, although the device is connected to a 5 V power rail for use in external communications. Typically, a level shifter converts the inner voltage levels of 0 V and 3.3 V used by a microprocessor chip to the output voltage levels of 0 V and 5 V. However, a voltage difference of 5V between gates and drains/sources of output transistors may easily break own the gate oxide and fail the device.

Figure 1:
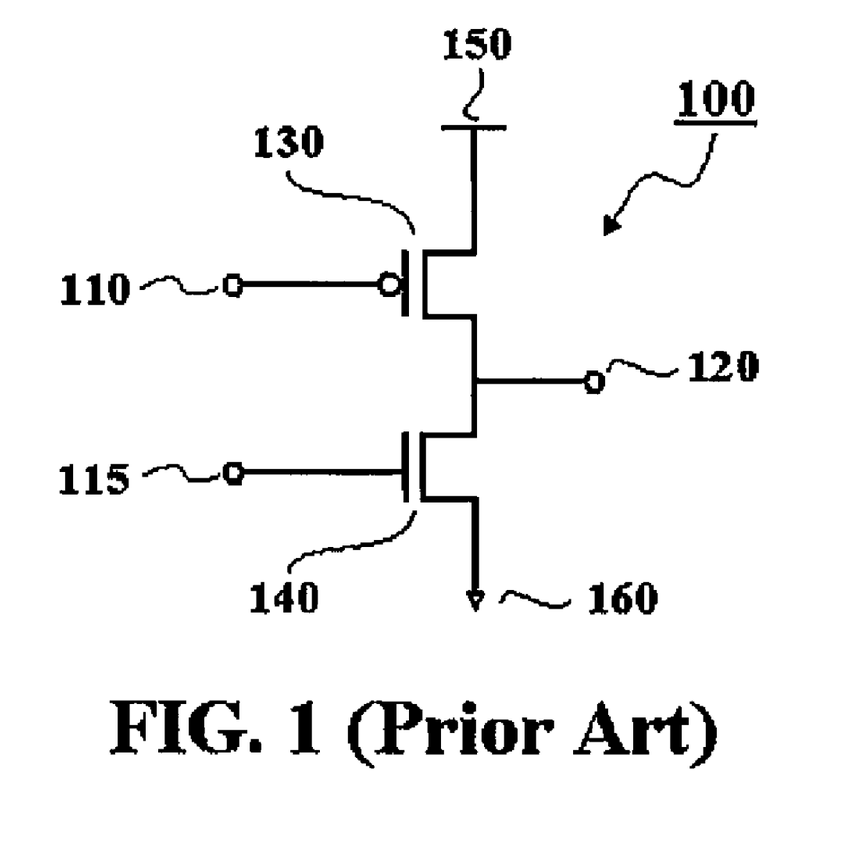
FIG. 1 is a schematic diagram of a conventional output circuit.

As shown in FIG. 1, a conventional inverter comprises a PMOS transistor 130 and an NMOS transistor 140 connected in series and may be used as an output buffer to drive an input/output circuit. A source of the PMOS transistor 130 is connected to an external power supply terminal 150 of 5V while a source of the NMOS transistor 140 is connected to an external ground voltage 160 of 0V. The drains of PMOS transistor 130 and NMOS transistor 140 are connected to an output node 120 to transmit an output signal. The gates of PMOS transistor 130 and NMOS transistor 140 are connected to an input node 110 to receive an input signal. When the input signal of 0V (logic low) is applied, the PMOS transistor 130 turns on and the NMOS transistor 140 turns off. The inverter outputs a signal of 5V (logic high). The voltage difference between the gate and the drain/source of the PMOS transistor 130 is 5V. When the input signal of 5V (logic high) is applied, the PMOS transistor 130 turns off and the NMOS transistor 140 turns on. The inverter outputs a signal of 0V (logic low). The voltage difference between the gate and the drain/source of the NMOS transistor 140 is 5V.

Typically, to avoid a gate oxide breakdown, the electric field across the gate oxide is required to be smaller than 5 MV/cm. Assuming that gate oxide is 80 angstroms in a modern semiconductor manufacturing process, a voltage difference of 5V results in an electric field of 6.25 MV/cm across the gate oxide, which causes a gate oxide breakdown.

One way to address this problem is to lower the voltage used as the logic high value of the input signal high which in turns lowers a voltage difference between the gate and the drain/source of output transistors. Using this lower voltage logic high also lowers the voltage difference between the external power supply connected to the source of the PMOS transistor 130 and the logic high input signal provided to the gate of the PMOS transistor 130 prevents the PMOS transistor 130 from turning completely off. A static current flowing from the external power terminal to the external ground is undesirable.

SUMMARY OF THE PREFERRED EMBODIMENTS

An integrated circuit comprises a first input node and a second input node, an output node, a first output transistor of a first type and a second output transistor of a second type, and a first clamping transistor of the second type and a second clamping transistor of a second type. The first clamping transistor, the first output transistor, the second clamping transistor, and the second output transistor are coupled in series across a first power supply terminal and a second power supply terminal. The first input node is coupled to a gate of the first output transistor. The second input node is coupled to a gate of the second output transistor. The output node is coupled to a common node of the first output transistor and the second clamping transistor. A gate of the first clamping transistor is coupled to a first reference voltage. A gate of the second clamping transistor is coupled to a second reference voltage.

BRIEF DESCRIPTION OF THE DRAWINGS

A more complete understanding of the present invention can be obtained by reference to the detailed description of embodiments in conjunction with the accompanying drawings, which form part of the disclosure. These drawings depict only a typical embodiment of the invention and do not therefore limit its scope. They serve to add specificity and details, in which.

DETAILED DESCRIPTION

Particularly preferred embodiments protect the gate oxide of an I/O circuit by providing a lower voltage difference between the gate and the drain or source. This is preferably accomplished in a way that avoids persistent current flow in any of the transistors of the I/O circuit.

Figure 2:
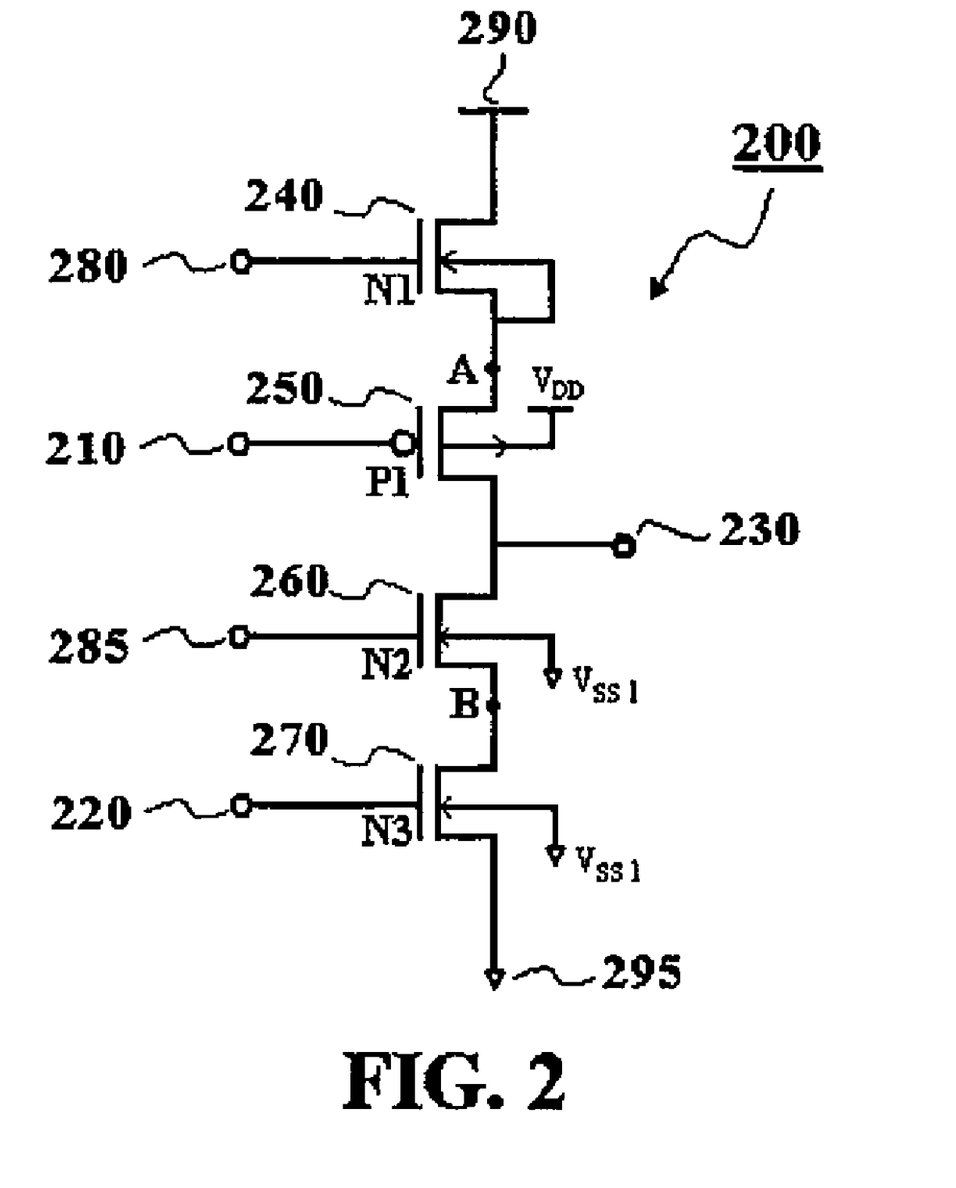
FIG. 2 is a schematic diagram of an embodiment of a gate oxide protected I/O circuit.

As shown in FIG. 2, an exemplary embodiment of an output circuit 200 includes a first input node 210, a second input node 220, an output node 230, a first output transistor 250, a second output transistor 270, a first clamping transistor 240, and a second clamping transistor 260. P-type transistors and N-type transistors are available as possible first or second type transistors in the output circuit. One or the other type of transistor can be defined as the first type so long as the definition is maintained throughout the example. The first output transistor 250 is a first type transistor. The second output transistor 270, the first clamping transistor 240, and the second clamping transistor 260 are a second type transistor. The first clamping transistor 240, the first output transistor 250, the second clamping transistor 260, and the second output transistor 270 are connected in series across a first power supply terminal 290 and a second power supply terminal 295. The first input node 210 is connected to a gate of the first output transistor 250. The second input node 220 is connected to a gate of the second output transistor 270. The output node 230 is connected to a common node of the first output transistor 250 and the second clamping transistor 260. A gate of the first clamping transistor 240 is connected to receive a first reference voltage ($V_{REF1}$) from a first reference voltage node 280. A gate of the second clamping transistor 260 is connected to receive a second reference voltage ($V_{REF2}$) from a second reference voltage node 285.

A voltage of point A ($V_A$), a common node of the first output transistor 250 and the first clamping transistor 240, is maintained approximately less than the difference between the first reference voltage ($V_{REF1}$) and a threshold voltage ($V_{TH1}$) of the first clamping transistor 240. That is to say, $V_A \leq V_{REF1} - V_{TH1}$. The first reference voltage is preferably lower than a voltage of the first power supply terminal 290, which holds the first clamping transistor 240 in an ON state. The voltage of point A is lower than the first reference voltage which in turn is preferably lower than the voltage of the first power supply terminal. As a result, the maximum voltage difference across a gate oxide of the first output transistor 250 is reduced.

Similarly, a voltage of point B ($V_B$), a common node of the second output transistor 270 and the second clamping transistor 260, is maintained approximately less than the difference between the second reference voltage ($V_{RREF2}$) and a threshold voltage ($V_{TH2}$) of the second clamping transistor 260. That is to say, $V_B \leq V_{REF2} - V_{TH2}$. In a preferred embodiment, the second reference voltage is lower than the maximum voltage of the outside circuit which may be connected to the output node 230. The maximum voltage of the outside circuit is usually the same as the voltage of the first power supply terminal 290. Accordingly, the voltage of point B is preferably lower than the maximum voltage that the second clamping transistor 260 may receive from the output node 230. As a result, the voltage difference across a gate oxide of the second output transistor 750 is reduced.

In a preferred embodiment, the first output transistor 250 is a PMOS transistor (P1). The first clamping transistor 240, the second clamping transistor 260, and the second output transistor 270 are NMOS transistors (N1, N2, and N3 respectively). The voltage of the first power supply terminal 290 is approximately 5 Volts (V). The voltage of the second power supply terminal 295 is approximately 0V, ground voltage. The first reference voltage is approximately 4.5V. The second reference voltage is approximately 3.3V. A voltage of a logic high and logic low signal for the first input node 210 and the second input node 220 is approximately 3.8V and 0V respectively. The threshold voltage of the NMOS transistors 240 and 260 is approximately 0.3V. Accordingly, the voltage of the point A is maintained not to exceed approximately 4.2V and the voltage of the point B is maintained not to exceed approximately 3.0V. Other factors may further lower the voltage of point A. As a result, the voltage of point A is preferred to be maintained substantially the same as the voltage of logic high input which is approximately 3.8V. [Please describe how to control other factors to further lower the voltage of point A to about 3.8V.]

When the input signal is at logic high, the first input node 210 and the second input node 220 are connected to approximately 3.8V. Because the voltage of point A is maintained substantially the same as the voltage of a logic high input signal, the source of the first output transistor P1 is connected to approximately 3.8V. The first output transistor P1 turns off. The source of the second output transistor N3 is connected to ground. The gate of the second output transistor 270 is connected to approximately 3.8V. The second output transistor N3 turns on. The voltage of the output signal is approximately 0V. The voltage difference across the gate oxide of the second output transistor N3 is about 3.8V.

When the input signal is at logic low, the first input node 210 and the second input node 220 are connected to approximately 0V. Because the voltage of point A is maintained to be substantially the same as the voltage of a logic high input signal, the source of the first output transistor P1 is connected to approximately 3.8V. The first output transistor P1 turns on. The source of the second output transistor N3 is connected to ground. The second output transistor N3 turns off. The voltage of the output signal is approximately 3.8V. The voltage difference across the gate oxide of the first output transistor P1 is about 3.8V.

Because of the first clamping transistor N1 and the value of the first reference voltage, a stress on the gate oxide of the first output transistor P1 is reduced and the gate oxide of transistor P1 does not break down when the output is connected to a high external voltage. Typically, to avoid a gate oxide breakdown, an electronic field across the gate oxide is required to be smaller than 5 MV/cm. Assuming a gate oxide thickness of 80 angstroms in a present day semiconductor manufacturing process, a voltage difference of 3.8V results in an electric field of 4.75 MV/cm across the gate oxide, which is generally too low to cause gate oxide breakdown.

The second clamping transistor N2 and the second reference voltage maintain the voltage of point B below approximately 3V when the output node 230 is connected to 5V. As a result, a stress on the gate oxide of the second output transistor N3 is reduced to avoid the gate oxide breakdown when transistor N3 is connected to a high external voltage. A voltage difference of 3V results in an electric field of 3.75 MV/cm across the gate oxide, which is generally too low to cause gate oxide breakdown.

In another embodiment, a substrate of the first clamping transistor 240 is connected to a common node (point A) of the first clamping transistor 240 and the first output transistor 250 rather than the substrate of the transistor 240 being connected to a default voltage. Accordingly, the threshold voltage of the first clamping transistor 240 is smaller. The voltage at point A consequently increases which may facilitate the output signal to be recognized as a logic high. Substrates of the first output transistor 250, the second output transistor 270, and the second clamping transistor 260 are connected to their respective default voltages. The default voltage for the substrate of a PMOS transistor is the voltage of the first power supply terminal 290 while the default voltage for the substrate of an NMOS transistor is the voltage of the second power supply terminal 295.

Figure 3A:
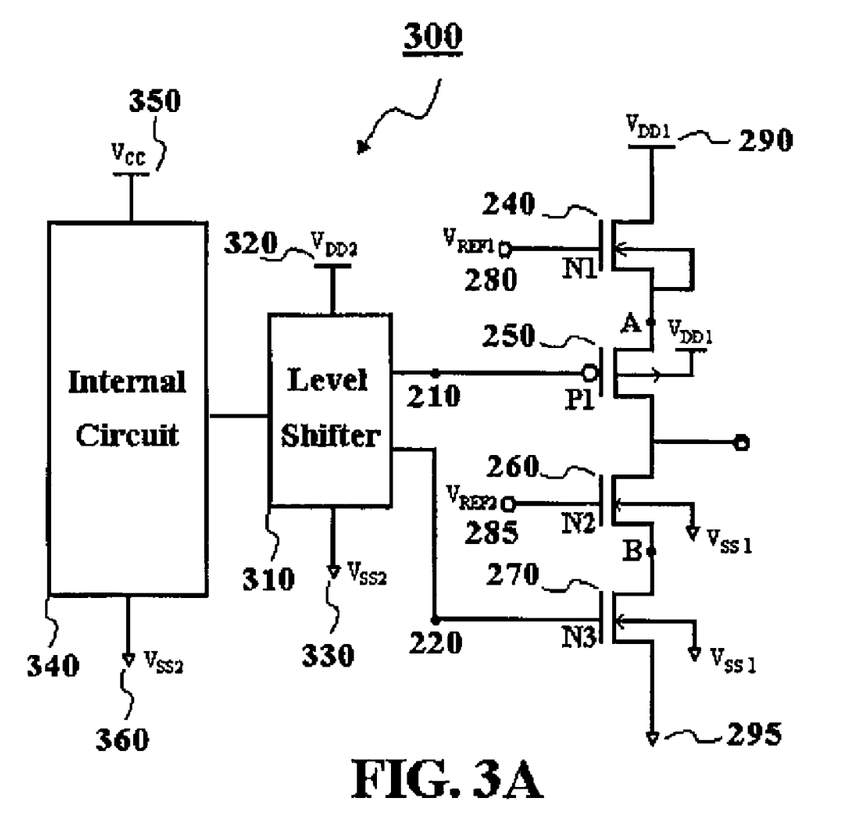
FIGS. 3A and 3B are schematic diagrams of another embodiment of the gate oxide protected I/O circuit shown in FIG. 2, which further includes a level shifter and an internal circuit.
Figure 3B:
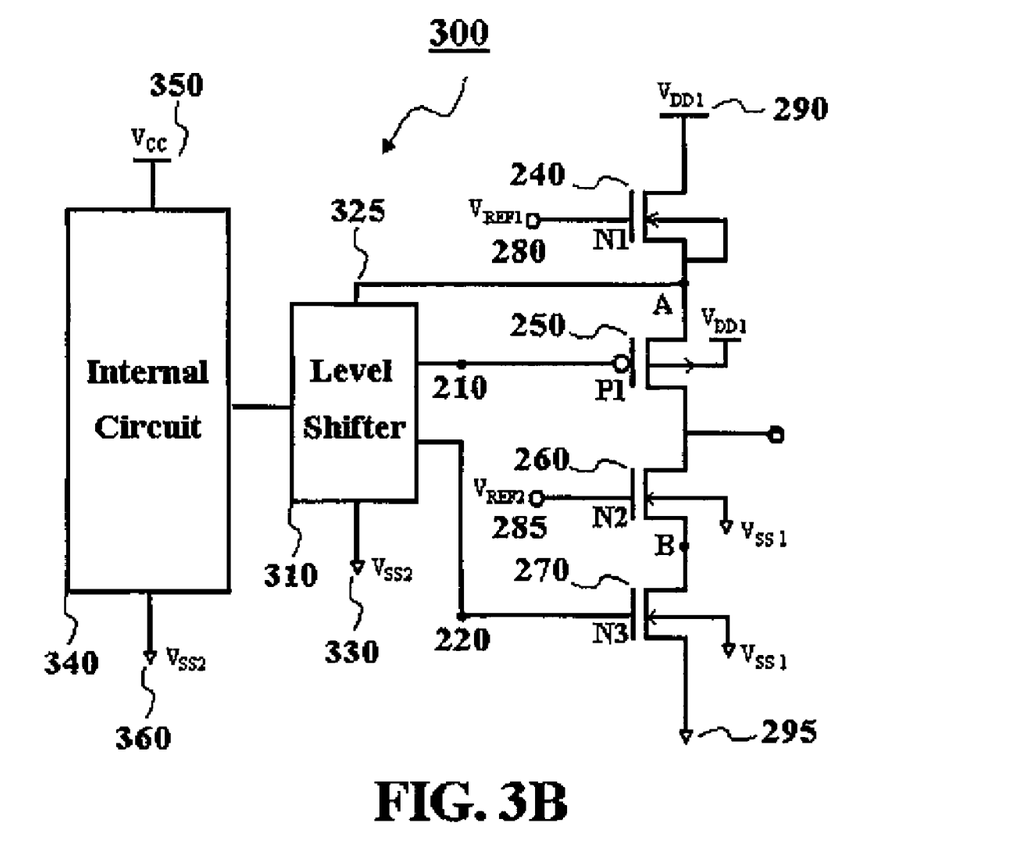

FIGS. 3A and 3B show another embodiment of an integrated circuit 300 which includes a level shifter 310 and an internal circuit 340. The internal circuit 340 outputs signals to a level shifter 310 which in turn outputs signals to the first input node 210 and the second input node 220. The level shifter 310 is connected to a third and a fourth power supply terminal 320 and 330. The internal circuit 340 is connected to a fifth and a sixth power supply terminal 350 and 360($V_{SS2}$).

In one embodiment, the voltage provided by the first power supply terminal ($V_{DD1}$) to the output circuit is preferably larger than the voltage provided by the third power supply terminal ($V_{DD2}$) to the level shifter 310, which in turn is preferably larger than the voltage provided by the fifth power supply terminal ($V_{CC}$) to the internal circuit 340. The second power supply terminal ($V_{SS1}$), the third power supply terminal ($V_{SS2}$), and the fifth power supply terminal ($V_{SS2}$) are connected to ground. The first reference voltage ($V_{REF1}$) is arranged to make the voltage of point A ($V_A$) substantially the same as the voltage provided by the third power supply terminal ($V_{DD2}$). As a result, the first output transistor 250 can be completely turned off when the input signal is at logic high. The first reference voltage ($V_{REF1}$) is preferably higher than the voltage provided by the third power supply terminal ($V_{DD2}$) and preferably lower than the voltage provided by the third power supply terminal ($V_{DD1}$). The second reference voltage ($V_{REF2}$) is preferably lower than the first reference voltage ($V_{REF1}$) to limit hot carriers which may reduce the lifetime of the second output transistor 270. Because the voltage provided by the fifth power supply terminal ($V_{CC}$) is lower than the first reference voltage ($V_{REF1}$), the fifth power supply terminal 350 can provide the second reference voltage ($V_{REF2}$).

When an external power supply 290 ($V_{DD1}$) turns on, the related power supply voltages of the integrated circuit turn on through a power-up stage and then remain stable while the circuit is active. For example, the voltage of the third power supply terminal ($V_{DD2}$) is generated from the voltage of the first power supply terminal ($V_{DD1}$). The voltages of the first power supply terminal ($V_{DD1}$) and the third power supply terminal ($V_{DD2}$) are used to generate the first reference voltage ($V_{REF1}$). When the external power supply turns on, the voltage of the first power supply terminal ($V_{DD1}$), for example, increases from 0V to 5V and then remains stable. Meanwhile, the voltage of the first power supply terminal ($V_{DD1}$) raises the voltage of the third power supply terminal ($V_{DD2}$), for example, from 0V to 3.8V, which then remains stable. Similarly, the voltages of the first power supply terminal ($V_{DD1}$) and the third power supply terminal ($V_{DD2}$) raise the first reference voltage ($V_{REF1}$), for example, from 0V to 4.5V, which then remains stable. When the first reference voltage ($V_{REF1}$) reaches a predetermined value, the integrated circuit switches from power-up to active operation. While the circuit is active, the first reference voltage ($V_{REF1}$) feeds back to generate the voltage of the third power supply terminal ($V_{DD2}$).

Figure 4A:
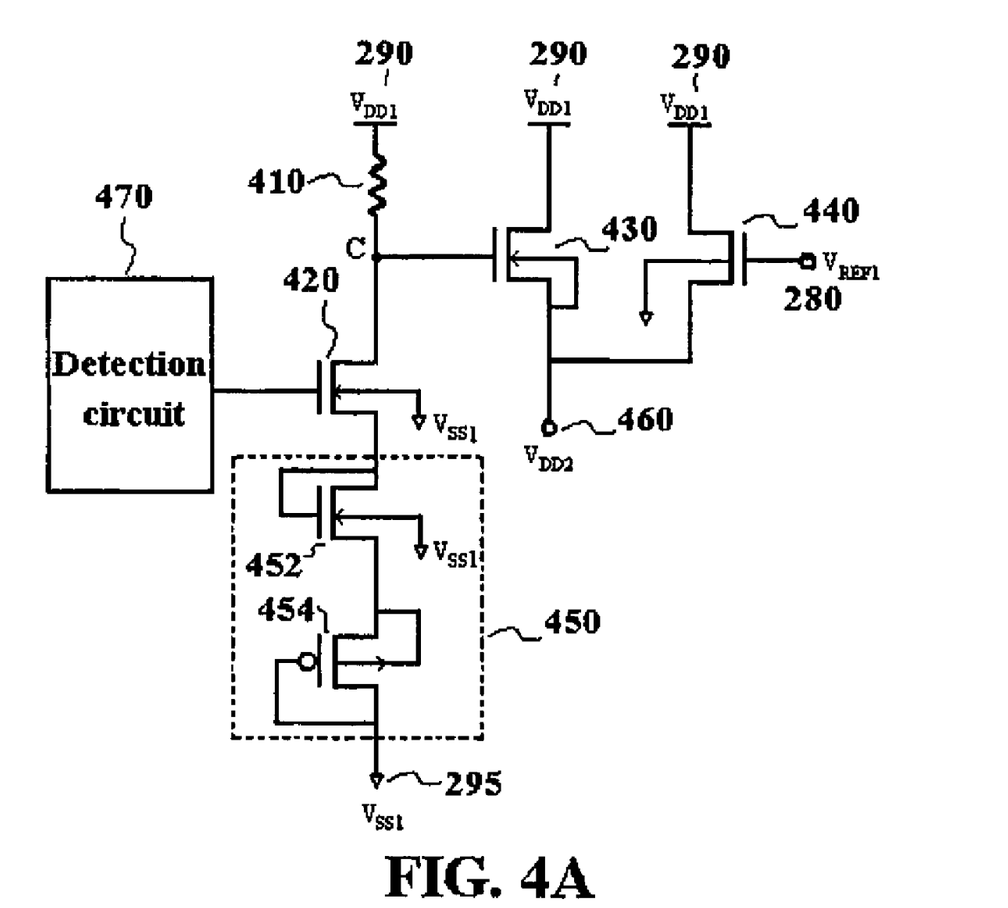
FIGS. 4A and 4B are schematic diagrams of an embodiment of a power-up circuit and a detection circuit for generating a power supply of the level shifter in FIG. 3.
Figure 4B:
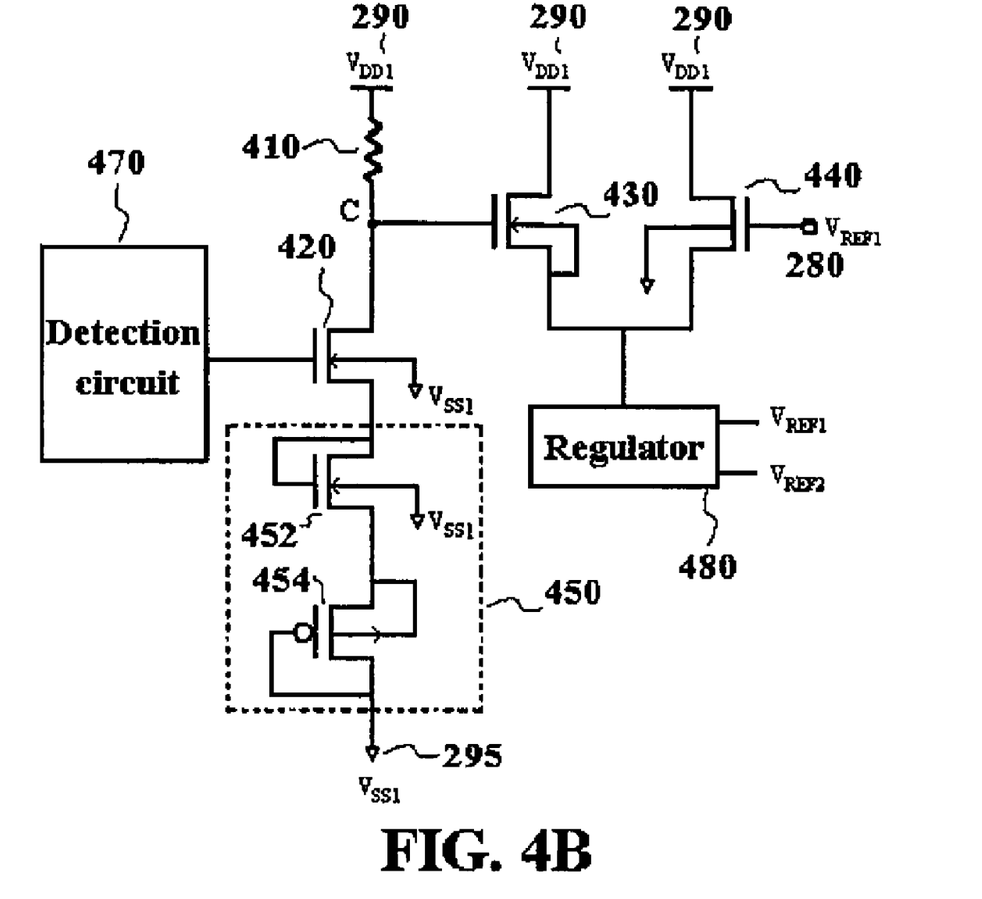

In order to generate the voltage of the third power supply terminal ($V_{DD2}$) during the power-up stage and the active stage, another embodiment of an integrated circuit includes a power-up circuit and a detection circuit 470 as shown in FIGS. 4A and 4B. The power-up circuit contains a resistor 410, a switch transistor 420, a power-up stage transistor 430, an active stage transistor 440, a first protection circuit 450, and a third power supply node 460. The resistor 410, the switch transistor 420, and the first protection circuit 450 are connected in series across the first power supply terminal 290 and the second power supply terminal 295. A gate of the switch transistor 420 is connected to the detection circuit 470 to receive a switch signal.

A first end of the power-up stage transistor 430 is connected to the first power supply terminal 290. A second end of the power-up stage transistor 430 is connected to the third power supply node 460. A gate of the power-up stage transistor 430 is connected to a common node of the resistor 410 and the switch transistor 420. A first end of the active stage transistor 440 is connected to the first power supply terminal 290. A second end of the active stage transistor 440 is connected to the third power supply node 460 and the second end of the power-up stage transistor 430. A gate of the active stage transistor 440 is connected to the first reference voltage node 280.

During power-up, the voltage of the third power supply terminal ($V_{DD2}$) is generated from the power-up stage transistor 430. The voltage of the third power supply terminal ($V_{DD2}$) is approximately the same as the difference between the voltage of the first power supply terminal ($V_{DD1}$) and a threshold voltage of the power-up stage transistor 430. The voltage of the third power supply terminal ($V_{DD2}$) further contributes to the generation of the first reference voltage ($V_{REF1}$). Upon detecting that the first reference voltage ($V_{REF1}$) increases to a predetermined value, the detection circuit 470 sends a switch signal to turn on the switch transistor 420. A voltage of point C ($V_C$), that is a common node of the resistor 410, the power-up stage transistor 430 and the switch transistor 420, significantly drops to turn off the power-up stage transistor 430. The voltage of the third power supply terminal ($V_{DD2}$) is then generated from the active stage transistor 440 after the first reference voltage ($V_{REF1}$) has reached a predetermined value.

To protect the gate oxide of the power-up stage transistor 430 from breakdown, the voltage of point C preferably is slightly higher than the voltage of the second power supply terminal ($V_{SS1}$). The first protection circuit 450 having a first protection transistor 452 and a second protection transistor 454 can increase the voltage of point C ($V_C$) to avoid gate oxide breakdown. In addition, when the switch transistor 420 turns on, a current may flow from the first power supply terminal ($V_{DD1}$) to the second power supply terminal ($V_{SS1}$) through the resistor 410, the switch transistor 420, and the protection circuit 450. The resistor 410 preferably has a large resistance to limit current flow and power dissipation.

In one embodiment, the switch transistor 420, the power-up stage transistor 430, the active stage transistor 440, and the first protection transistor 452 are NMOS transistors. The second protection transistor 454 is a PMOS transistor. Drains of the power-up stage transistor 430 and the active stage transistor 440 are connected to the first power supply terminal 290 ($V_{DD1}$). Sources of the power-up stage transistor 430 and the active stage transistor 440 are connected to the third power supply node 460 ($V_{DD2}$). The gate of the active stage transistor 440 is connected to the first reference signal node 280 ($V_{REF1}$). A substrate and the source of the power-up stage transistor 430 are connected together. The gate of the power-up stage transistor 430 is connected to the resistor 410 and a drain of the switch transistor 420. A drain and a gate of the first protection transistor 452 are connected to a source of the switch transistor 420. A substrate of the first protection transistor 452 is connected to the first power supply terminal ($V_{DD1}$). A source of the first protection transistor 452 is connected to a source and a substrate of the second protection transistor 454. A gate and a drain of the second protection transistor 454 are connected to the second power supply terminal ($V_{SS1}$).

Figure 5A:
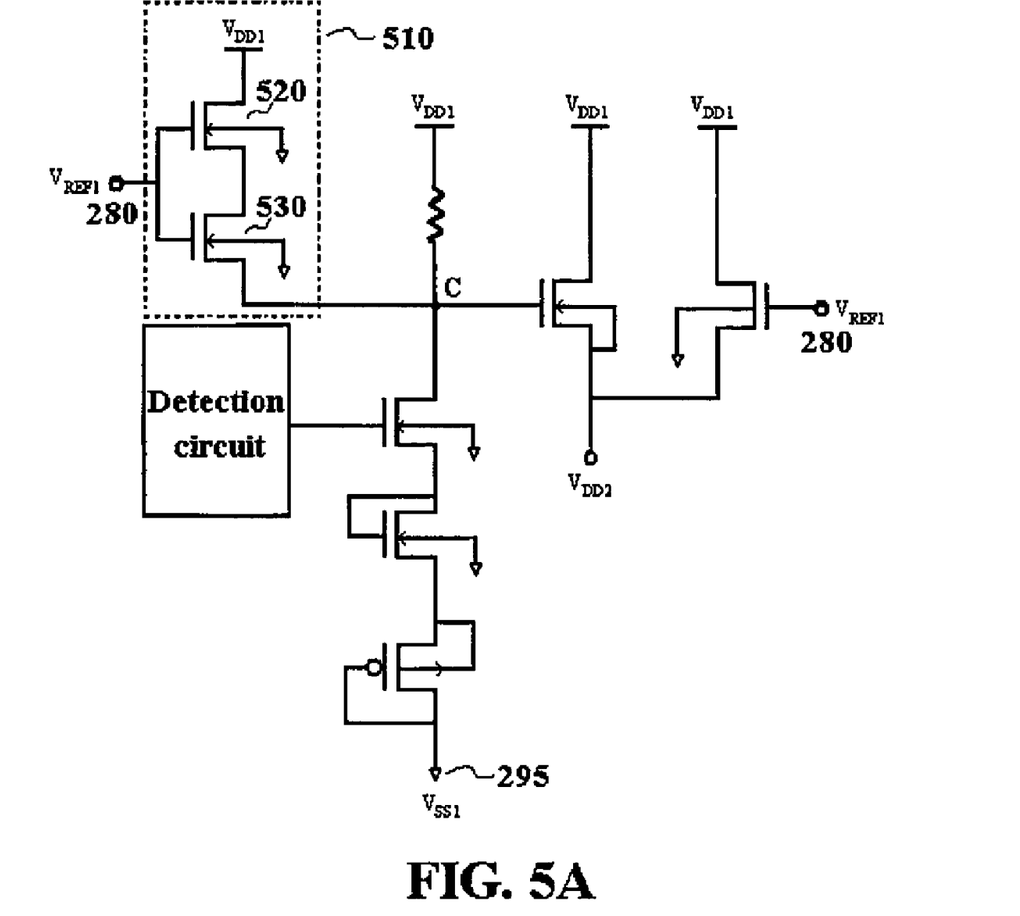
FIGS. 5A and 5B are schematic diagrams of another embodiment of the power-up circuit shown in FIG. 4, which includes a second protection circuit.
Figure 5B:
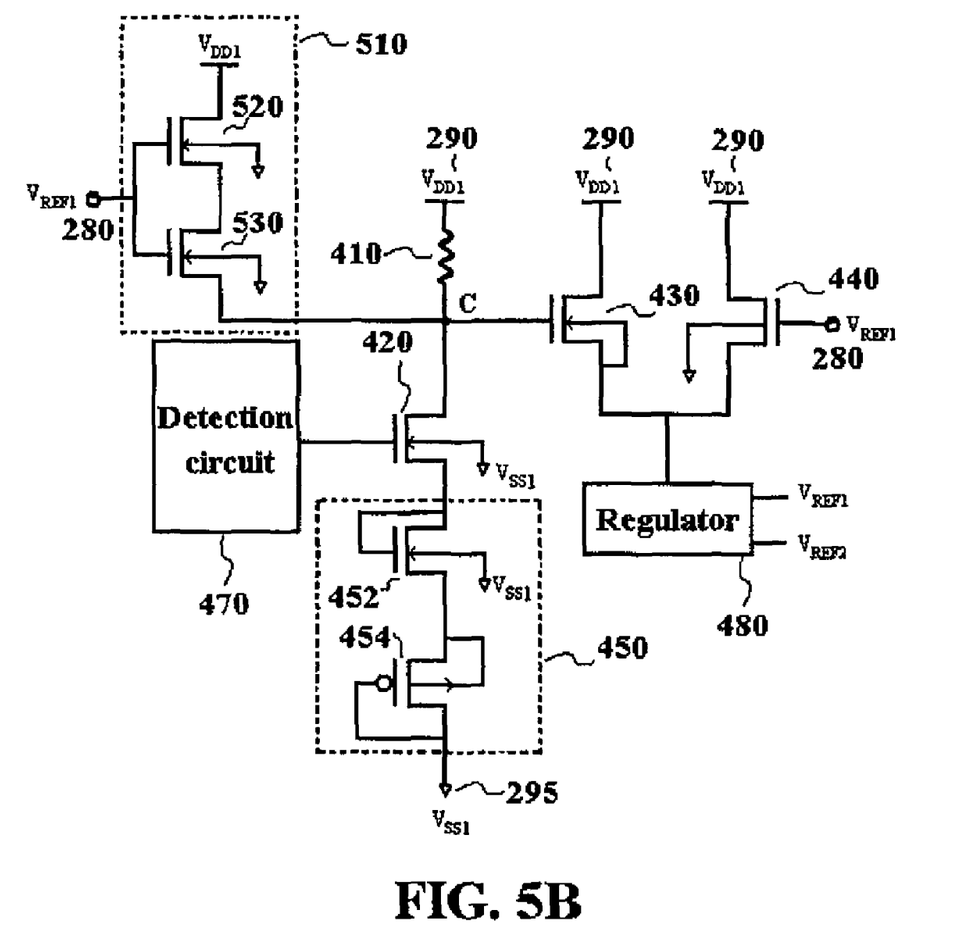

FIGS. 5A and 5B show another embodiment of a power-up circuit which further includes a second protection circuit 510 to protect the gate oxide of the power-up transistor 430 from breakdown. The second protection circuit 510 has a third protection transistor 520 and a fourth protection transistor 530 connected in series to increase the voltage of point C ($V_C$). A first end of the third protection transistor 520 is connected to a first power supply terminal. A second end of the third protection transistor 520 is connected to a first end of the fourth protection transistor 530. Gates of the third protection transistor 520 and the fourth protection transistor 530 are connected to the first reference voltage ($V_{REF1}$). A second end of the fourth protection transistor 530 is connected to the common node of the resistor 410 and the switch transistor 420.

Although the invention has been described in terms of exemplary embodiments, it is not limited thereto. The described embodiment is to be considered in all respects only as illustrative and not as restrictive. The present invention may be embodied in other specific forms without departing from its essential characteristics. The scope of the invention, therefore, is indicated by the appended claims rather than by the foregoing description. All changes which come within the meaning and range of the equivalents of the claims are to be embraced within their scope.

What is claimed is:

1. An integrated circuit comprising:
a first input node and a second input node;
an output node;
a first output transistor of a first type and a second output transistor of a second type; and
a first clamping transistor of the second type and a second clamping transistor of the second type,
wherein the first type can be a PMOS or an NMOS and the second type can respectively be an NMOS or a PMOS, the first clamping transistor, the first output transistor, the second clamping transistor, and the second output transistor are coupled in series across a first power supply terminal and a second power supply terminal, the first input node is coupled to a gate of the first output transistor, the second input node is coupled to a gate of the second output transistor, the output node is coupled to a common node of the first output transistor and the second clamping transistor, a gate of the first clamping transistor is coupled to a first reference voltage, and a gate of the second clamping transistor is coupled to a second reference voltage;
a level shifter coupled to the first input node and the second input node;
a power-up circuit coupled to the level shifter and the first power supply terminal, and;
a detection circuit coupled to the power-up circuit;
wherein the power-up circuit has a first state when the detection circuit determines a first condition, and provides a first voltage to the level shifter; and
a second state when the detection circuit determines a second condition, and provides a second voltage to the level shifter.

2. The circuit of claim 1, wherein
the first condition is the first reference voltage has not reached a target voltage, and the second condition is the first reference voltage has reached the target voltage.

3. The circuit of claim 1, wherein
the power-up circuit comprises a resistor, a power-up stage transistor, an active stage transistor, a switch transistor, a first protection circuit, and a third power supply node coupled to the level-shifter;
the resistor, the switch transistor, and the first protection circuit are coupled in series across the first power supply terminal and the second power supply terminal, a gate of the switch transistor coupled to the detection circuit to receive a switch signal;

a first end of the power-up stage transistor is coupled to the first power supply terminal, a second end of the power-up stage transistor is coupled to the third power supply node, a gate of the power-up stage transistor is coupled to a common node of the resistor and the switch transistor; and
a first end of the active stage transistor is coupled to the first power supply terminal, a second end of the active stage transistor is coupled to the third power supply node and the second end of the power-up transistor, a gate of the active stage transistor is coupled to the first reference voltage.

4. The circuit of claim 3, wherein
the power-up stage transistor and the active stage transistor are NMOS transistors;
a substrate and the second end of the power-up stage transistor are coupled to each other; and
a substrate of the active stage transistor is coupled to the second power supply terminal.

5. The circuit of claim 3, wherein
the first protection circuit comprises a first protection transistor and a second protection transistor coupled in series.

6. The circuit of claim 5, wherein
the first protection transistor comprises an NMOS transistor and the second protection transistor comprises a PMOS transistor;
a drain of the first protection transistor is coupled to the switch transistor, a gate and the drain of the first protection transistor are coupled to each other, a source of the first protection transistor is coupled to a source of the second protection transistor, a substrate of the first protection transistor is coupled to the second power supply terminal; and
the source and a substrate of the second protection transistor are coupled to each other, a gate and a drain of the second protection transistor are coupled to each other, the drain of the second protection transistor is coupled to the second power supply terminal.

7. The circuit of claim 3, further comprising:
a second protection circuit coupled to a common node of the resistor and the switch transistor.

8. The circuit of claim 7, wherein
the second protection circuit comprises a third protection transistor and a fourth protection transistor coupled in series; and
a first end of the third protection transistor is coupled to a first power supply terminal, a second end of the third protection transistor is coupled to a first end of the fourth protection transistor, gates of the third protection transistor and the fourth protection transistor are coupled to the first reference voltage, a second end of the fourth protection transistor is coupled to the common node of the resistor and the switch transistor.

* * * * *